United States Patent
Pamperin et al.

(10) Patent No.: US 7,893,756 B2
(45) Date of Patent: Feb. 22, 2011

(54) PRECISION CURRENT SOURCE

(75) Inventors: Jill Marie Pamperin, Peyton, CO (US); Steven Douglas Roach, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 82 days.

(21) Appl. No.: 12/271,028

(22) Filed: Nov. 14, 2008

(65) Prior Publication Data

US 2010/0123516 A1    May 20, 2010

(51) Int. Cl.
G05F 1/10 (2006.01)
G05F 3/02 (2006.01)

(52) U.S. Cl. .................................. 327/543; 327/541

(58) Field of Classification Search .................. 327/538, 327/540, 541, 543; 323/315–316; 345/76
See application file for complete search history.

(56) References Cited

U.S. PATENT DOCUMENTS

| | | | |
|---|---|---|---|
| 5,488,321 A * | 1/1996 | Johnson | 327/66 |
| 5,703,582 A * | 12/1997 | Koyama et al. | 341/120 |
| 6,297,688 B1 * | 10/2001 | Nakamura | 327/538 |
| 6,486,731 B2 * | 11/2002 | Yamasaki et al. | 327/541 |
| 6,809,577 B2 * | 10/2004 | Matsumoto et al. | 327/541 |
| 6,897,619 B2 * | 5/2005 | Shimizu | 315/169.3 |
| 6,922,182 B2 * | 7/2005 | Sase | 345/76 |
| 7,414,458 B2 * | 8/2008 | Wu et al. | 327/540 |
| 7,606,085 B2 * | 10/2009 | Wada et al. | 365/189.09 |
| 7,633,335 B2 * | 12/2009 | Fujikura et al. | 327/540 |
| 2009/0153234 A1 * | 6/2009 | Bhuiyan | 327/538 |

* cited by examiner

Primary Examiner—Quan Tra

(57) ABSTRACT

A device for providing a precision current includes a first operational amplifier and multiple path transistors. The first operational amplifier outputs a gate voltage based on reference voltage and input voltages. The path transistors have corresponding gates for receiving the gate voltage from the first operational amplifier. Each path transistor is connected to a first enable transistor configured to selectively connect the path transistor to a reference path and a second enable transistor configured to selectively connect the path transistor to an output path. The first and second enable transistors are separately enabled by first and second enable signals, respectively. At least one path transistor is connected to the reference path through a corresponding first enable transistor to provide the reference current, and least one other path transistor is connected to the output path through a corresponding second enable transistor to provide the precision current based on the reference current.

20 Claims, 10 Drawing Sheets

PRECISION CURRENT SOURCE

BACKGROUND

Many electronic devices require a precision current for proper operation. For example, multi-meters require a precision current from measuring resistance and capacitance values. In both cases, the current is sourced into a device under test (DUT) and voltage is measured across it. When the voltage and current are known (as well as time for a capacitor), the value of the resistance or capacitance can be calculated. However, the current must be precisely maintained in order for results to be accurate and consistent.

In order to assure a precision current, precision components may be added to the electronic circuit. In the case of a multi-meter, for example, numerous additional precision resistors and at least one precision operational amplifier (OpAmp) and a switch may be added to the circuit to provide a precision current, e.g., to the DUT. However, such additional components are expensive and occupy additional board space, adding cost and size to the end product. In addition, they may inhibit achieving complete accuracy.

SUMMARY

In a representative embodiment, a device for providing a precision current includes a first operational amplifier and multiple path transistors. The first operational amplifier is configured to output a gate voltage based on a reference voltage and an input voltage. The path transistors have corresponding gates connected to the first operational amplifier to receive the gate voltage. Each path transistor is connected to a first enable transistor configured to selectively connect the path transistor to a reference path and a second enable transistor configured to selectively connect the path transistor to an output path. The first and second enable transistors are separately enabled by first and second enable signals, respectively. At least one path transistor of the multiple path transistors is connected to the reference path through a corresponding first enable transistor to provide the reference current. At least one other path transistor of the multiple path transistors is connected to the output path through a corresponding second enable transistor to provide the precision current based on the reference current.

In another representative embodiment, a device for providing a precision current includes a main operational amplifier and multiple current branches. The main operational amplifier is configured to output a gate voltage based on a main reference voltage and an input voltage. Each current branch includes a path transistor gated to the operational amplifier and a switch for selectively connecting the path transistor to one of a reference path and an output path. At least a first current branch of the current branches is initially connected to the reference path through a corresponding first switch to provide a reference current, and at least a second current branch of the current branches is initially connected to the output path through a corresponding second switch to provide the precision current. The second current branch is rotated to be connected to the reference path through the corresponding second switch to provide the reference current.

In another representative embodiment, a device for providing a precision current includes reference and output paths, and first and second current branches. The reference path is configured to provide a reference current, and includes a main operational amplifier for outputting an amplifier voltage. The output path is configured to output the precision current based on at least the reference current. The first current branch includes a first path transistor having a gate connected to the main operational amplifier to receive the amplifier voltage, a source connected to a first voltage and a drain connected to a first switch, the first switch including a first enable transistor configured to selectively connect the first path transistor to the reference path to provide the reference current and a second enable transistor configured to selectively connect the first path transistor to the output path to provide the precision current. The second current branch includes a second path transistor having a gate connected to the main operational amplifier to receive the amplifier voltage, a source connected to the first voltage and a drain connected to a second switch, the second switch including a third enable transistor configured to selectively connect the second path transistor to the reference path to provide the reference current and a third enable transistor configured to selectively connect the second path transistor to the output path to provide the precision current.

The device for providing a precision current further includes multiple leakage prevention circuits and first and second a cascode operational amplifiers. The leakage prevention circuits are connected to the first, second, third and fourth enable transistors to prevent current leakage when the first, second, third and fourth enable transistors are off, respectively. The first cascode operational amplifier is in the reference path and is configured to provide an enable voltage to a gate of one of the first enable transistor or the third enable transistor through a corresponding inverter circuit to selectively activate the one of the first or third enable transistor. The second cascode operational amplifier is in the output path and is configured to provide an enable voltage to a gate of one of the second enable transistor or the fourth enable transistor through a corresponding inverter circuit to selectively activate the one of the second or fourth enable transistor.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such apparatuses methods are clearly within the scope of the present teachings.

Figure 1:
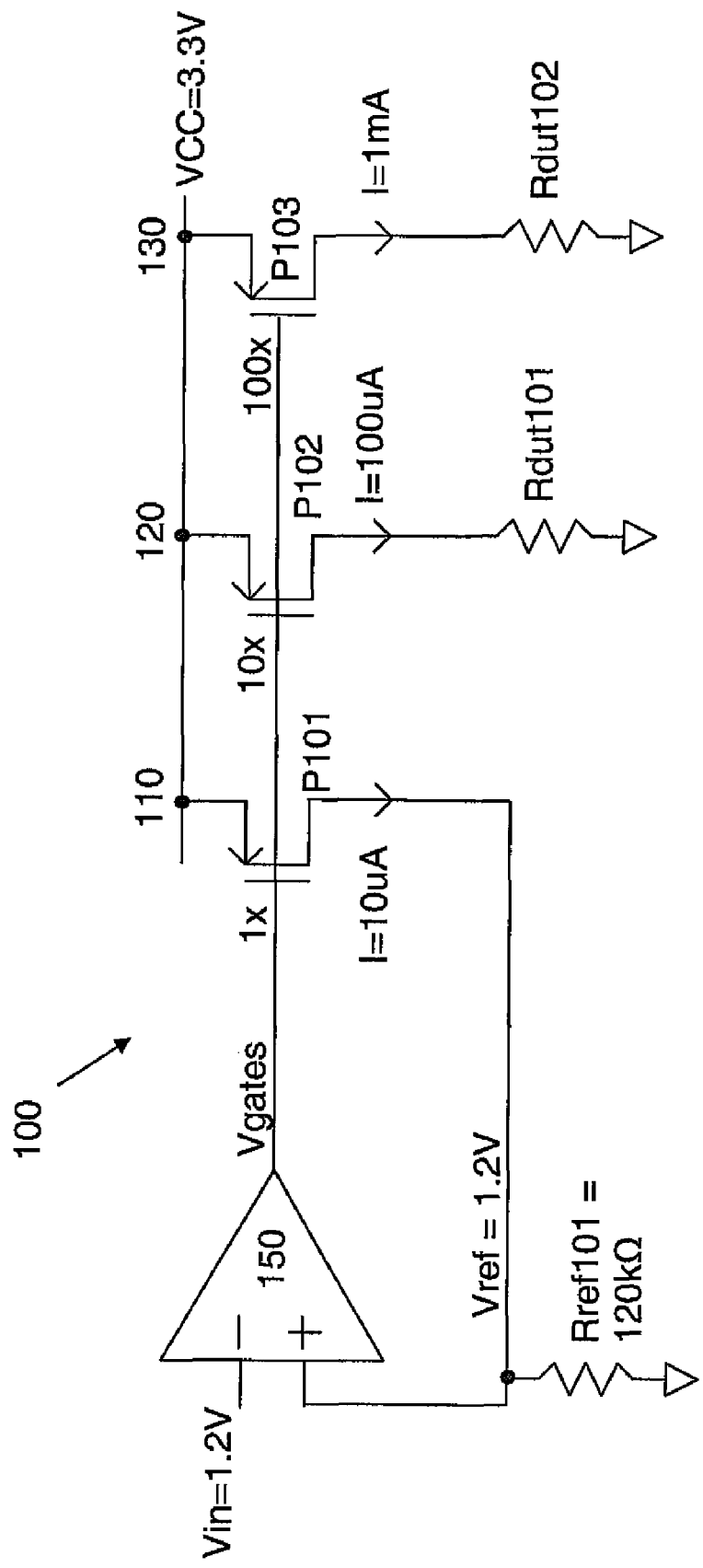
FIG. 1 is a circuit diagram illustrating a conventional current source.
Figure 2:
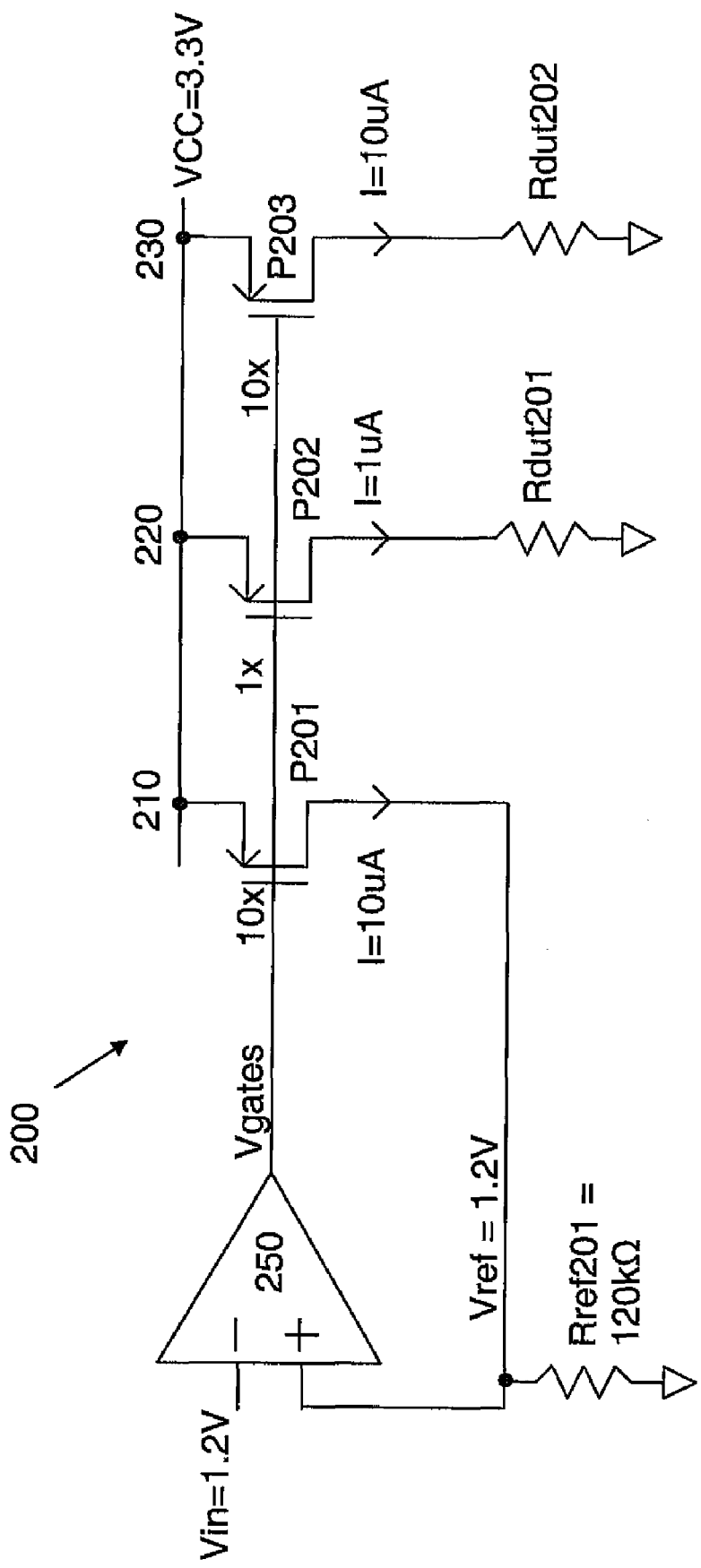
FIG. 2 is a circuit diagram illustrating a conventional current source.
Figure 3:
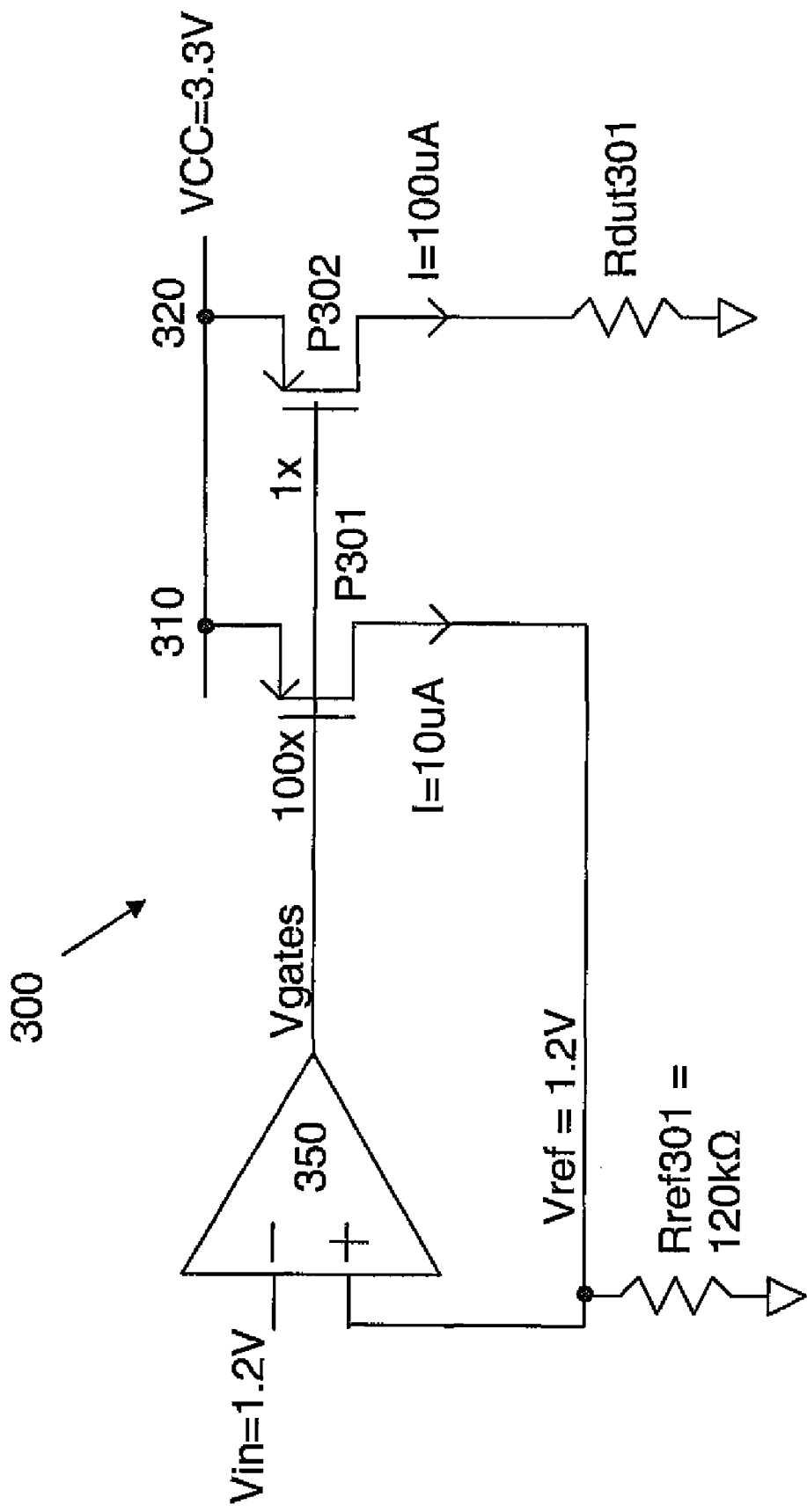
FIG. 3 is a circuit diagram illustrating a conventional current source.

A current source typically needs to be capable of providing multiple current levels at varying orders of magnitude. For example, a current source may span five decades of current at corresponding current settings, such as 100 nA, 1 μA, 10 μA, 100 μA, and 1 mA. FIGS. 1-3 are circuit diagrams illustrating conventional current sources, which collectively provide these five current settings. Although depicted separately, it is understood that the current sources of FIGS. 1-3 may be included in a single instrument having five outputs corresponding to the five current settings.

FIG. 1 shows an example of current source 100 which provides 100 μA and 1 mA currents based on a reference current of 10 μA and a reference voltage of 1.2V. In particular, the current source 100 provides an OpAmp controlled current mirror, which includes OpAmp 150, a reference path that includes one transistor P101 in current branch 110, and an output path that includes ten transistors P102 (indicated by 10x) in current branch 120 and 100 path transistors P103 (indicated by 100x) in current branch 130. The path transistors P101, P102 and P103 may be PMOS transistors, for example, having gates connected to receive gate voltage Vgates from the OpAmp 150. The path transistor P101 in the reference path passes a current of 10 μA, which generates a reference voltage Vref of 1.2V across reference resistance Rref101 (120 kΩ). The reference voltage Vref and an input voltage Vin (also 1.2V) are input to the OpAmp 150 to provide Vgates.

The output path current branches 120 and 130 correspond to output currents of 100 μA and 1 mA output currents, respectively. The 100 μA and 1 mA output currents may be provided to a device under test (DUT), indicated in FIG. 1 by resistances Rdut101 and Rdut102, respectively corresponding to the current branches 120 and 130.

Referring to current branch 120, the "10x" next to path transistor P102 indicates that there are ten substantially identical transistors (of which, only representative path transistor P102 is shown) sharing the same gate, source and drain connections in current branch 120. For example, each path transistor (P102) has a source connected to a voltage source Vcc (e.g., 3.3V), a drain connected to the DUT (Rdut101), and a gate connected to the output of the OpAmp 150 (Vgates). Each path transistor (P102) has only 10 μA, but the combined drain connections yield an aggregate current of 100 μA to the DUT (Rdut101). Similarly, referring to current branch 130, which includes path transistor P103, the "100x" indicates that there are 100 substantially identical transistors (of which, only representative path transistor P103 is shown) sharing the same gate, source and drain connections, as shown. Again, although each path transistor (P103) has only 10 μA, the combined drain connections yield an aggregate current of 1 mA to the DUT (Rdut102).

FIG. 2 shows an example of a current source 200 that provides 1 μA and 10 μA currents based on a reference current of 10 μA and a reference voltage of 1.2V. In particular, the current source 200 provides an OpAmp controlled current mirror, which includes OpAmp 250, a reference path that includes ten path transistors P201 (indicated by 10x) in current branch 210, and an output path that includes one path transistor P202 (indicated by 1x) in current branch 220 and ten path transistors P203 (indicated by 10x) in current branch 230. The path transistors P201, P202 and P203 may be PMOS transistors, for example, having gates connected to receive gate voltage Vgates from the OpAmp 250. Unlike the current source 100, each path transistor P201, P202 and P203 has only 1 μA passing through it. Accordingly, for example, there must be ten path transistors P201 to attain the reference current of 10 μA.

The output path current branches 220 and 230 correspond to output currents of 1 μA and 10 μA output currents, respectively. The 1 μA and 10 μA output currents may be provided to a DUT, for example, indicated by resistances Rdut201 and Rdut202, respectively corresponding to the current branches 220 and 230.

Referring to current branch 220, the "1x" next to path transistor P202 indicates that there is one transistor, having a source connected to a voltage source Vcc (e.g., 3.3V), a drain connected to the DUT (Rdut201), and a gate connected to the output of the OpAmp 250 (Vgates), to provide 1 μA to Rdut1201. Referring to current branch 230, the "10x" next to path transistor P203 indicates that there are ten substantially identical transistors (of which, only representative path transistor P203 is shown) sharing the same gate, source and drain connections, as shown. Each path transistor (P203) has only 1 μA, but the combined drain connections yield an aggregate current of 10 μA to the DUT (Rdut202).

FIG. 3 shows an example of a current source 300 that provides a 100 nA current based on a reference current of 10 μA and a reference voltage of 1.2V. The current source 300 provides an OpAmp controlled current mirror, which includes OpAmp 350, a reference path that includes 100 path transistors P301 (indicated by 100x) in current branch 310, and an output path that includes one path transistor P302 (indicated by 1x) in current branch 320. The path transistors P301 and P302 may be PMOS transistors, for example, having gates connected to receive gate voltage Vgates from the OpAmp 350. Each path transistor P301 and P302 has only 100 nA (0.1 μA) passing through it. Therefore, in current branch 320 of the output path, the "1x" indicates that there is one transistor (path transistor 302), which provides 100 nA to Rdut301.

Each of the current sources 100, 200 and 300 has its own reference path and output path, potentially having multiple DUT connections. Further, each of the current sources 100, 200 and 300 has a dedicated OpAmp 150, 250 or 350, respectively, and assumes a precision 1.2V reference voltage, which component is specifically purchased or made.

Figure 4:
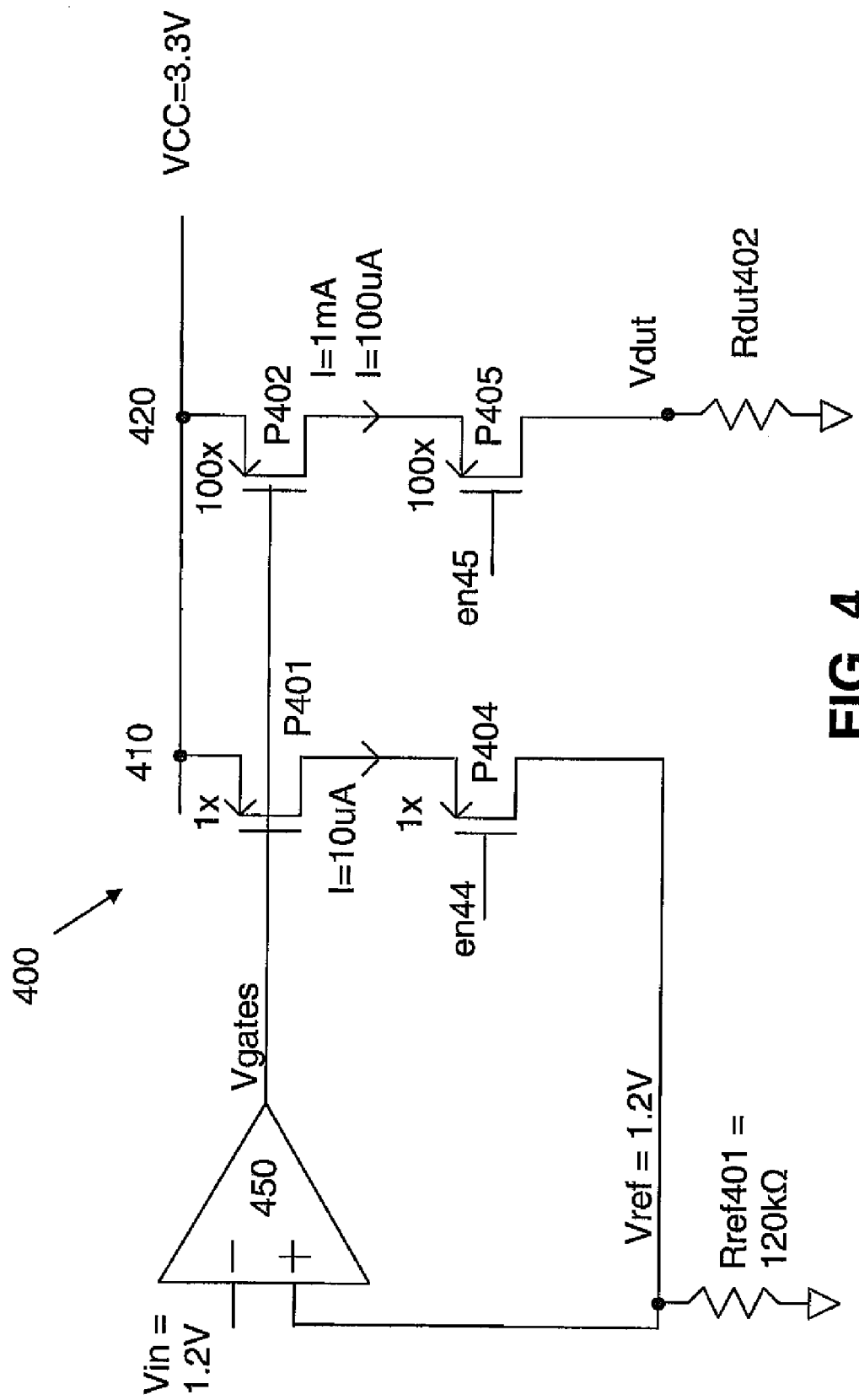
FIG. 4 is a circuit diagram illustrating a precision current source, according to a representative embodiment.

FIG. 4 is a circuit diagram illustrating a precision current source, according to a representative embodiment. In particular, FIG. 4 shows a current source 400 which includes OpAmp 450 and multiple switches or enable transistors P404, P405 and P406 for selectively activating corresponding current branches of reference and output paths.

Referring to FIG. 4, the precision current source 400 of FIG. 4 includes current branch 410 in the reference path and multiple current branches 420 in the output path. More particularly, the reference path includes one current branch 410 (indicated by 1*x*) having one path transistor P401 and one corresponding enable transistor P404. The enable transistor P404 selectively enables the current branch 410 and/or the path transistor 401 based on corresponding enable signal en44.

The output path includes 100 current branches 420 (indicated by 100*x*), each of which has a path transistor P402 and a corresponding enable transistor P405. The enable transistor P405 selectively enables the corresponding current branch 420 and/or the path transistor 402 based on corresponding enable signal en45. Accordingly, the output path includes 100 path transistors P401) and 100 corresponding enable transistors P405 (indicated by 100*x*). In the depicted embodiment, since each current branch 420 includes a separate enable transistor P405, any number of current branches 420 and path transistors 402 may be enabled, and thus connected to the DUT, indicated by resistance Rdut402. The currents provided by enabled path transistors 402 are added in order to provide a desired output current. For example, when ten of the path transistors 402 are enabled, the output path provides an output current of 100 µA and when all 100 of the path transistors 402 are enable, the output path provides an output current of 1 mA, based on a reference current of 10 µA and a reference voltage of 1.2V, which may be a precise voltage. Also, unlike the current source 100, for example, there may be only one connection to the DUT, indicated by resistance Rdut402. The voltage across Rdut402, based on the current from current branch(es) 420 is indicated by Vdut.

Any time one of the current branches 420 of the output path is selected via corresponding enable transistor P405, the reference path transistor P401 must also be selected via enable transistor P404. This provides an OpAmp controlled current mirror, which includes OpAmp 450, reference path transistor P401 and path transistor P402.

Although only output path branch currents of 100 µA and 1 mA (correlating to the currents shown in FIG. 1) have been depicted in FIG. 4 for convenience of explanation, it understood that similarly configured current sources may include output path branch currents of 1 µA and 10 µA (correlating to the currents shown in FIG. 2) and an output path branch current of 100 nA (correlating to the currents shown FIG. 3). That is, each of the reference and output path transistors would include a corresponding enable transistor, connected in series and gated to a separate enabling signal for selectively activating/deactivating the respective reference path transistor or output path transistor in the same current branch.

Referring again to FIG. 4, each depicted enable transistor P404 and P405 can be used as a cascode as well, given better performance over changes in the DUT (e.g., Rdut402). Also, in the depicted embodiment, each output path transistors P402 in a current branch 420 has a corresponding enable transistor P405. However, in alternative embodiments, one enable transistor P405 may be included for selectively enabling/disabling all 100 path transistors P402 simultaneously, or for selectively enabling/disabling some predetermined subset (e.g., 10 or 50) of path transistors P402 simultaneously, in order to provide predetermined output currents using fewer enable transistors.

Whether connected to a single enable transistor or multiple corresponding enable transistors, there may be current leakage from path transistors P402 and/or enable transistors P405, particularly where there are 100 of each type of transistor. Therefore, a leakage prevention circuit may be added to each transistor to assure complete shut off of transistors and to prevent current leakage. For example, FIG. 5 is a circuit diagram illustrating a precision current source, according to a representative embodiment, which depicts leakage prevention circuits for transistors in each current branch.

For example, when using fewer than all 100 current branches 420, the path transistors 402 and enable transistors P405 not in use branch should be completely off (i.e., no leakage). This may be accomplished by disconnecting the gates of the path transistors P402 from the OpAmp 450, and tying them to the positive rail, connected to voltage source Vcc (e.g., 3.3V), and biasing the corresponding enable transistors P405 biased far into the cutoff region by providing a negative gate to source voltage.

Figure 5:
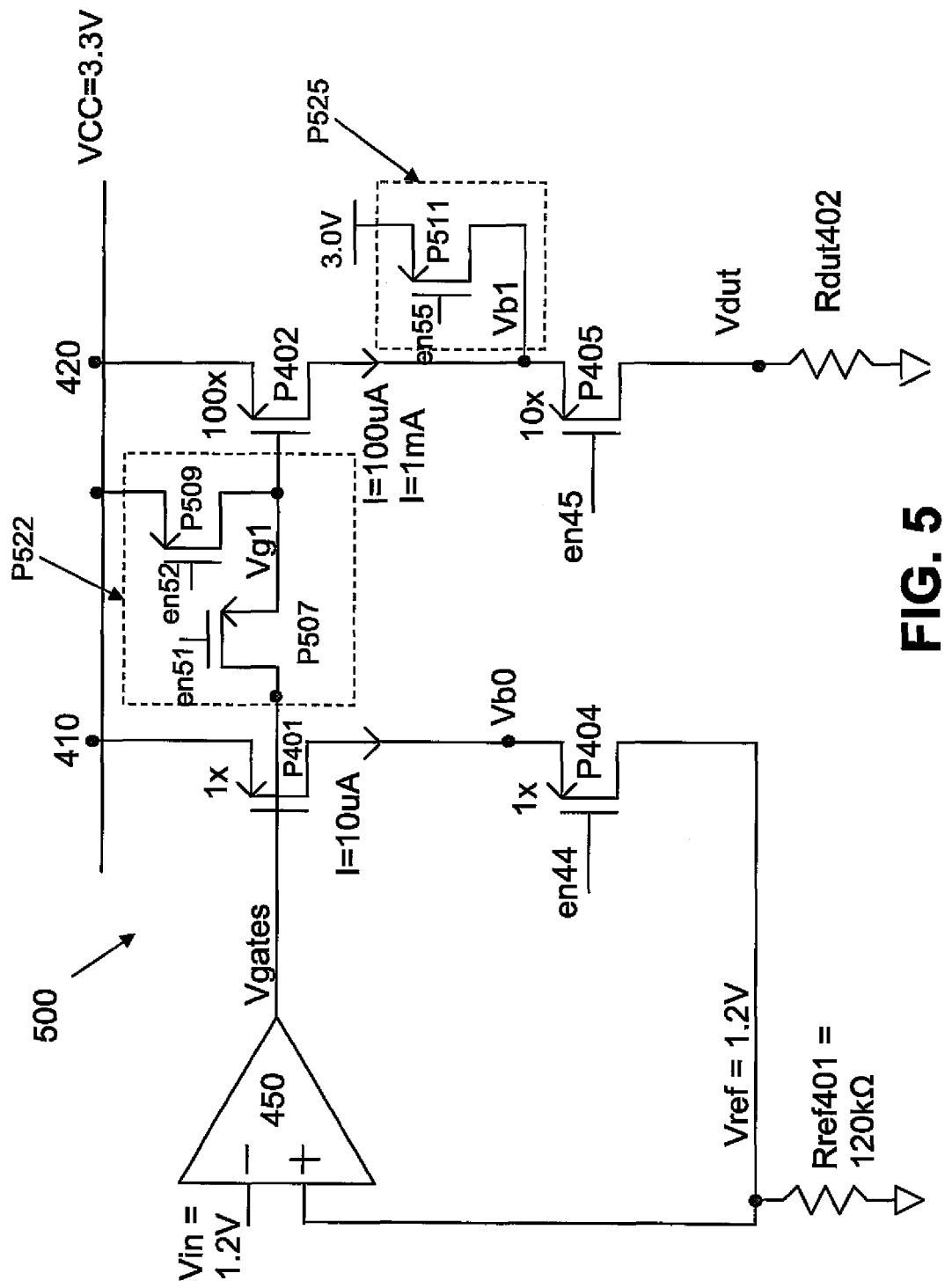
FIG. 5 is a circuit diagram illustrating a precision current source, according to a representative embodiment.

More particularly, FIG. 5 depicts representative precision current source 500, which is similar to precision current source 400 as indicated by like reference numbers, but further includes leakage prevention circuit P522 for each path transistor 402 and leakage prevention circuit P525 for each enable transistor 405, to assure shut-off of the respective transistors. Leakage prevention circuit P522 includes leak prevention transistors P507 and P509, which are respectively controlled by enable signals en51 and en52. Transistors P507 and P509 may be PMOS transistors, for example. Transistor P507 is shut off to selectively disconnect corresponding path transistor P402 from Vgates output by OpAmp 450. At the same time, transistor P509 is turned on to force voltage node Vg1 to a high voltage (3.3V), which shuts off path transistor P402. Referring to enable transistor P405, leakage prevention circuit P525 includes leak prevention transistor P511, which is controlled by enable signal en55. Transistor P511 may be a PMOS transistor, for example. Transistor P511 is turned on when enable transistor P405 is shut off, in order to force voltage node Vb1 to a high voltage level (3.0V), so that enable transistor P405 has 3.3V at its gate and 3.0V at its source.

Each enable transistor P405 has a corresponding leak prevention circuit 525. Thus, in an embodiment in which one enable transistor P405 selectively enables/disables multiple current branches 420, as discussed above, there is only one leak prevention circuit 525 per group of current branches P420. Also, in various embodiments, there may be one leak prevention circuit 522 for all path transistors P402 or a predetermined group of path transistors P402 (i.e., corresponding to a predetermined group of multiple current branches 420).

Accordingly, current leakage of the path and enable transistors is reduced or prevented by the representative configuration depicted in precision current source 500 of FIG. 5.

As discussed above, the precision current sources according to various embodiments may include numerous transistors, which are implemented in an integrated circuit (IC). Due to various factors, such as manufacturing processes and associated tolerances, the components (e.g., transistors) on the IC may have slightly different sizes (e.g., widths and lengths). This may result in certain transistors having more favorable characteristics or properties than others, depending on implementation. Therefore, it may be helpful to be able to select which transistors are used as reference path transistors and which are used as output path transistors, for example, using more precise transistors as the reference path transistors.

Figure 6:
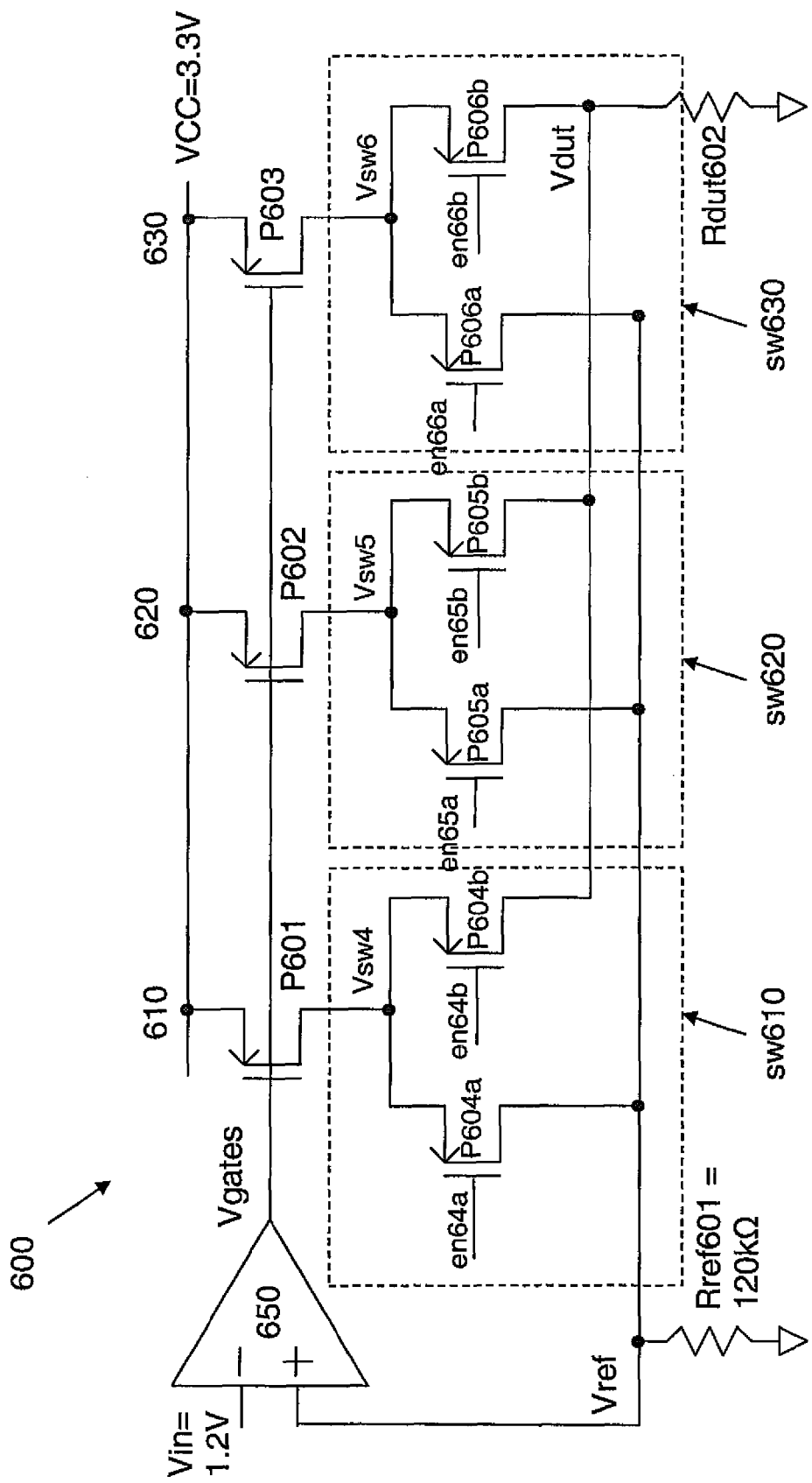
FIG. 6 is a circuit diagram illustrating a precision current source, according to a representative embodiment.

FIG. 6 is a circuit diagram illustrating a precision current source, according to a representative embodiment, which depicts a configuration in which each transistor may be allocated to the reference path (i.e., connected to the reference resistance Rref601) or to the output path (i.e., connected to the DUT resistance Rdut602). This configuration thus enables selection and/or rotation of the transistors among the reference and output paths.

More particularly, precision current source 600 is a simplified three mirror branch circuit, in which three representative path transistors P601, P602 and P603 are each configured to be selectively connected to one of the reference resistance Rref601 or the DUT resistance Rdut602. Each path transistor P601, P602 and P603 may be a PMOS transistor, for example, having a source connected to voltage source Vcc (e.g., 3.3V), a gate connected to the output voltage (Vgates) of OpAmp 650 and a drain connected to a corresponding switch node Vsw4, Vsw5 and Vsw6. Switch node Vsw4 is connected to a first switch sw610 including enable transistors P604a and P604b for selectively connecting path transistor P601 to the reference resistance Rref601 or the DUT resistance Rdut602, respectively. Likewise, switch node Vsw5 is connected to a second switch sw620 including enable transistors P605a and P605b for selectively connecting path transistor P602 to Rref601 or Rdut602, respectively, and switch node Vsw6 is connected to a third switch sw630 including enable transistors P606a and P606b for selectively connecting path transistor P603 to Rref601 or Rdut602, respectively. The enable transistors P604a, P604b, P605a, P605b, P606a and P606b are separately enabled by corresponding enable signals en64a, en64b, en65a, en65b, en66a and en66b.

In any of the first through third sets, only one enable transistor P604a or P604b, P605a or P605b, and P606a or P606b may be on at a time. The corresponding current branch 610, 620 or 630 (e.g., including path transistor P601, P602 or P603) may therefore be selectively connected to Rref601 or Rdut602. Also, both transistors in a set may be turned off, thus effectively disconnecting the corresponding path transistor from both Rref601 and Rdut602. This process enables selection of various numbers of transistors for both the reference and output paths, as well as rotation of transistors among the reference path, the output path and no path. The rotation may depend on various factors, such as specifications, accuracy, age and/or usage of each path transistor P601, P602, P603. For example, when the ratio of reference path transistors to output path transistors is 1:100 (e.g., as shown in current branches 410 and 420 of FIGS. 4 and 5), the path transistor selected to be the one reference path transistor should have a size in the middle of a distribution of transistor sizes (of the 101 transistors). Such a selection reduces the possibility of mismatch errors.

Sets of double switches for each current path 610, 620, 630, as shown in FIG. 6, is less costly than providing current mirror devices, for example. Also, the precision current circuit 600 enables each current branch 610, 620, 630 to be fully shut off when both enable signals en64a/en64b, en65a/en65b, en66a/en66b of the corresponding set shut off the pair of enable transistors 604a/604b, 605a/605b, 606a/606b. For example, when enable transistors 604a/604b are both shut off, then a 1:1 ratio between reference path and output path transistors may be created using just enable transistors 605a/605b and 606a/606b.

Accordingly, when there are more transistors available than needed for the reference and output paths to provide a particular precision current, an intelligent selection among the available transistors can be made. For example, the selected transistors may be a subset of the available transistors having the most uniform characteristics (e.g., length, width, performance, etc.). It is also possible to select the reference transistor based on other criteria, such as the most average transistor (e.g., the transistor having the most centralized properties among a range of transistor properties) or the transistor most precisely meeting design specifications, when only one reference path transistor and multiple output path transistors are needed. It is likewise possible to select an output path transistor on the same bases when only one output path transistor and multiple reference path transistors are needed. The sets of double switches for each current path (e.g., current paths 610, 620, 630) in the above representative embodiments also enable active rotation of the transistors (e.g., continuous or periodic rotation) between reference path and output path positions. Such rotation reduces noise and improves current accuracy, for example, and may be performed at any speed supported by the OpAmp 650. Also, rotation may use any subset(s) of available transistors, and may include rotating transistors so that they are not connected to either the reference path or the output path.

Figure 7:
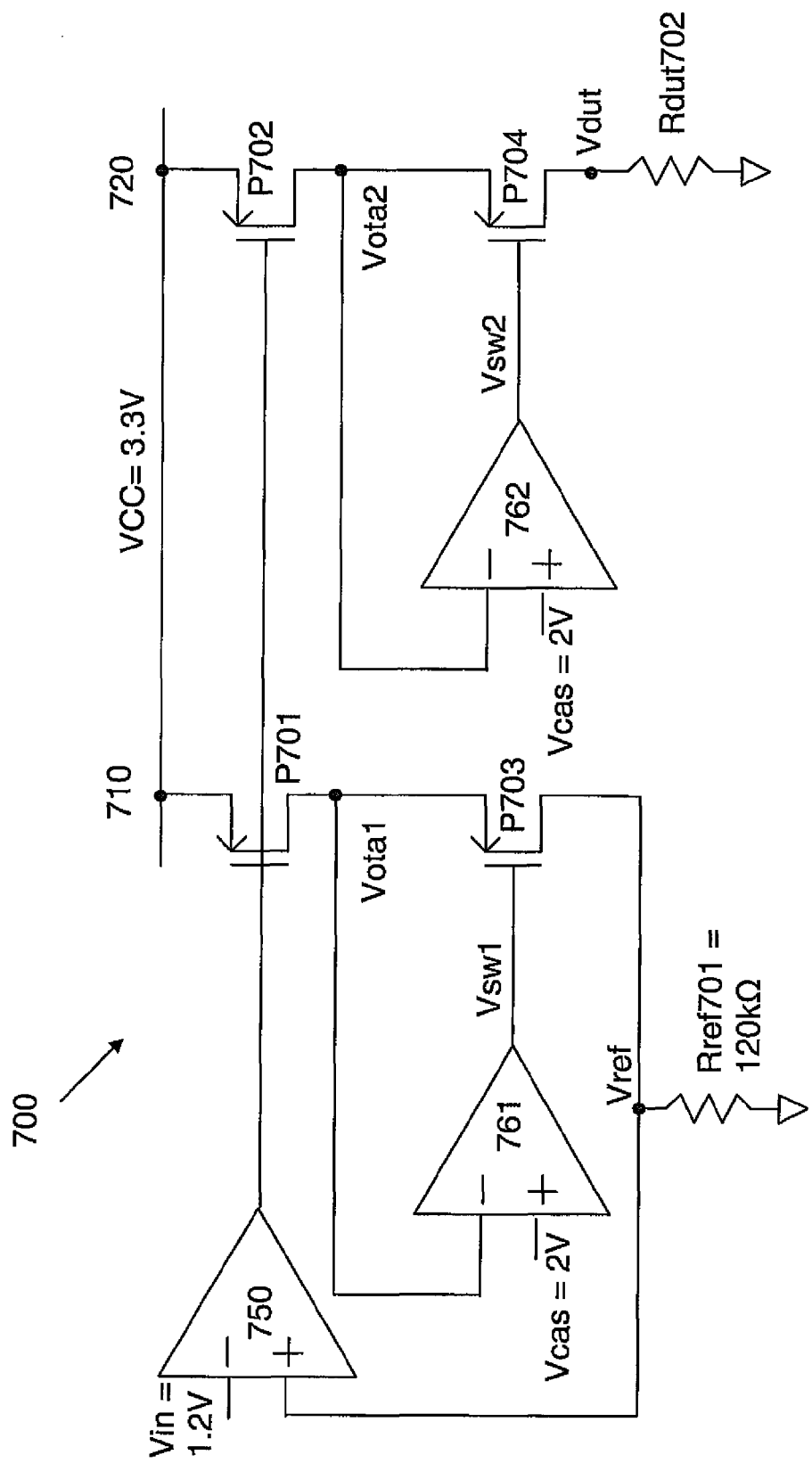
FIG. 7 is a circuit diagram illustrating a precision current source, according to a representative embodiment.

FIG. 7 is a circuit diagram illustrating a precision current source, according to a representative embodiment. In particular, FIG. 7 shows a precision current source 700, which includes cascode OpAmps 761 and 762 in the reference path and the output path, respectively, in addition to main OpAmp 750. In an embodiment, each of the OpAmps 761 and 762 may be an operational transconductance amplifier (OTA), for example, although other types of operational amplifiers may be incorporated to provide unique benefits for any particular situation or to meet application specific design requirements of various implementations, as would be apparent to one skilled in the art. Also, the OpAmps 761 and 762 may each have a higher bandwidth than the main OpAmp 750. For example, in an embodiment, the OpAmps 761 and 762 may each have a bandwidth of 100 Hz and the main OpAmp 750 may have a bandwidth of 1 Hz.

The representative reference path connected to Rref701 in FIG. 7 includes current branch 710, having path transistor P701 and corresponding enable transistor P703. The representative output path connected to Rdut702 includes current branch 720, having path transistor P702 and corresponding enable transistor P704. The path transistors P701 and P702 may be PMOS transistors, for example, having gates connected to receive gate voltage Vgates from the main OpAmp 750. The enable transistors P703 and P704 may also be PMOS transistors, for example, having gates connected to receive enable voltages Ven1 and Ven2 output from the cascode OpAmps 761 and 762, respectively. The cascode OpAmp 761 receives reference voltage Vcas1 (e.g., 2.0V), which may be an imprecise voltage, and the drain voltage Vota1 from path transistor P701 as input, and the cascode OpAmp 762 receives another reference voltage Vcas2 (e.g., 2.0V), which may be an imprecise voltage, and the drain voltage Vota2 from path transistor P702 as input. In various embodiments, Vcas1 and Vcas2 may be provided by the same voltage source or different voltage sources.

The precision current source 700 accordingly provides an improved cascode, in which the cascode OpAmps 761 and 762 and corresponding imprecise 2.0V reference voltages Vcas1 and Vcas2 are respectively included in the reference path and the output path. This configuration forces the drains of the current mirror path transistors P701 and P702 (as well as drains of additional path transistors (not shown)) to be the same voltage (e.g., Vota1=Vota2), regardless of the drain voltages of the corresponding enable transistors P703 and P704. In comparison, although the precision current source 600 of FIG. 6 provides a rotation system, it may not provide an effective cascode, depending on system requirements.

In the depicted representative embodiment, there is one OpAmp 761 in the reference path and one OpAmp 762 in the output path, which reduces power and interface requirements. In alternative embodiments, however, there may be additional cascode OpAmps, e.g., for every current branch.

The current source 700 of FIG. 7 does not allow for on/off functionality of the enable transistors P703 and P704, as described, for example, with respect to the enable transistors shown in FIGS. 4-6. However, in various embodiments, the on/off functionality may be included in order to selectively activate/deactivate current branches. For example, FIG. 8 is a circuit diagram illustrating a precision current source, according to a representative embodiment, which builds on the precision current source shown in FIG. 7 to include the capability of selectively activating/deactivating current branches using enable transistors.

Figure 8:
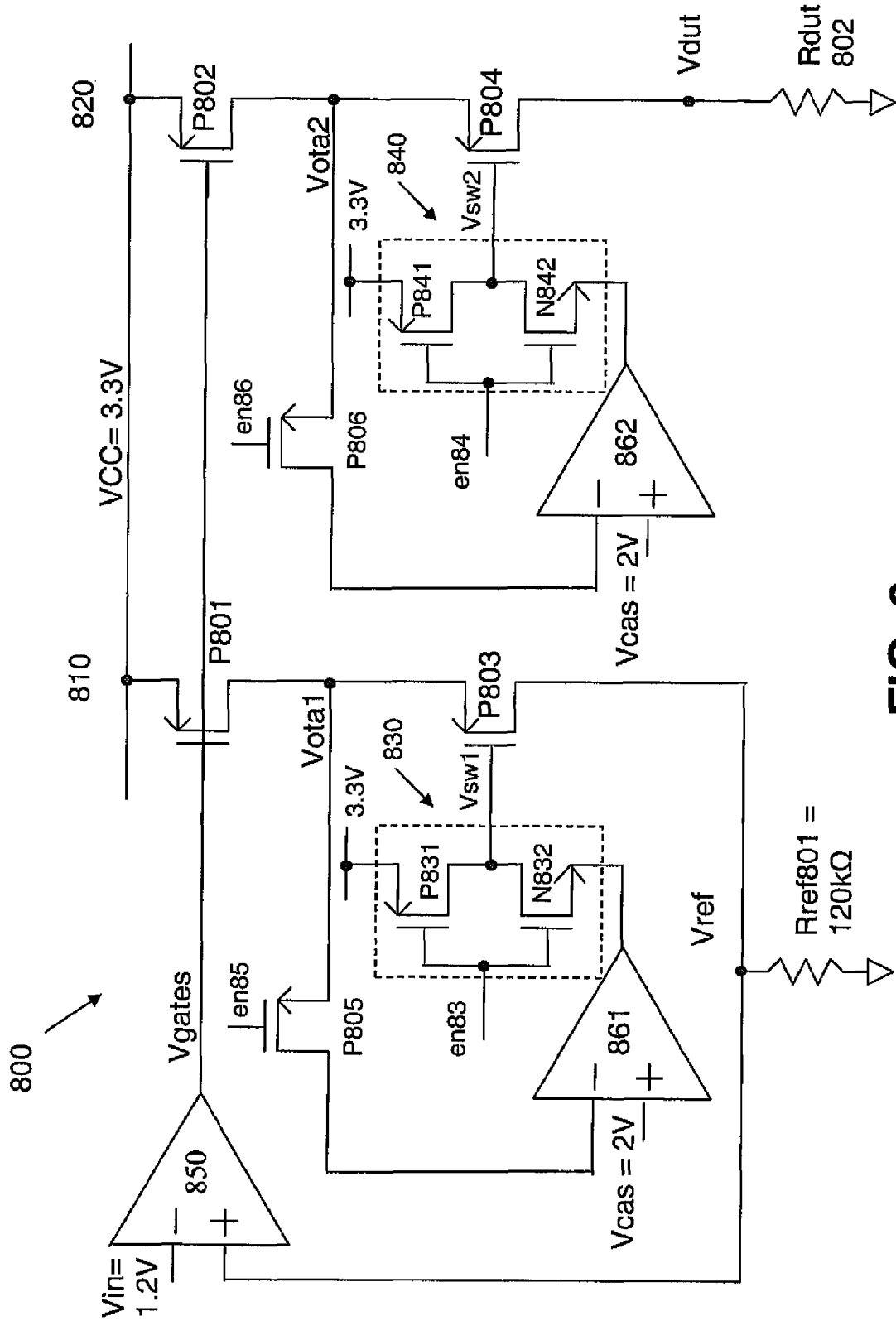
FIG. 8 is a circuit diagram illustrating a precision current source, according to a representative embodiment.

More particularly, FIG. 8 shows a representative precision current source 800, which includes cascode OpAmps 861 and 862, which are similar to cascode OpAmps 761 and 762 described above with respect to FIG. 7. Precision current source 800 further includes inverter control circuits 830 and 840 which enable on/off functionality of enable transistors P803 and P804, respectively. Therefore, the precision current source 800 maintains the cascode, as discussed above with respect to FIG. 7, as well as the selective on/off functionality of each current branch, as discussed above with respect to FIGS. 4-6.

Referring to FIG. 8, the reference path connected to Rref801 includes representative current branch 810, having path transistor P801 and corresponding enable transistor P803. The output path connected to Rdut802 includes representative current branch 820, having path transistor P802 and corresponding enable transistor P804. The path transistors P801 and P802 may be PMOS transistors, for example, having gates connected to receive gate voltage Vgates from the main OpAmp 850. The enable transistors P803 and P804 may also be PMOS transistors, for example, having gates connected to receive enable voltages Ven1 and Ven2 output from inverter control circuits 830 and 840, respectively.

Inverter control circuit 830 includes inverter transistors P831 and N832, which have opposite conductivity types, gated to enable signal en83. For example, inverter transistor P831 may be a PMOS transistor and inverter transistor N832 may be an NMOS transistor. The inverter transistor P831 includes a source connected to a high voltage source (e.g., 3.3V) and a drain connected to enable voltage Ven1, and inverter transistor N832 includes a source connected to the output of cascode OpAmp 861, as described above with respect to cascode OpAmp 761 of FIG. 7, and a drain connected to the enable voltage Ven1. Accordingly, when enable signal en83 is low (e.g., 0V), the inverter transistor P831 is on, and Ven1 becomes high (3.3V), which turns off enable transistor 803 and corresponding current branch 810. When enable signal en83 is high (e.g., 3.3V), the inverter transistor N832 is on, and Ven1 becomes the output of cascode OpAmp 861, as discussed above with respect to FIG. 7, turning on enable transistor P803.

Similarly, inverter control circuit 840 includes inverter transistors P841 and N842, which have opposite conductivity types, gated to enable signal en84. For example, inverter transistor P431 may be a PMOS transistor and inverter transistor N842 may be an NMOS transistor. The inverter transistor P841 includes a source connected to a high voltage source (e.g., 3.3V) and a drain connected to enable voltage Ven2, and inverter transistor N842 includes a source connected to the output of cascode OpAmp 862 and a drain connected to the enable voltage Ven2. Accordingly, when enable signal en84 is low (e.g., 0V), the inverter transistor P841 is on, and Ven2 becomes high (3.3V), which turns off enable transistor 804 and corresponding current branch 820. When enable signal en84 is high (e.g., 3.3V), the inverter transistor N842 is on, and Ven2 becomes the output of cascode OpAmp 862, turning on enable transistor P804.

Notably, the reference path further includes an additional enable transistor P815, which selectively disconnects the current branch 810 from the cascode OpAmp 861 in response to enable signal en85, whenever enable transistor P803 is off and thus the current branch 810, including the path transistor P801, is disconnected from Rref801. Likewise, the output path further includes an additional enable transistor P806, which selectively disconnects the current branch 820 from the cascode OpAmp 862 in response to enable signal en86, whenever enable transistor P804 is off and thus the current branch 820, including the path transistor P802, is disconnected from Rdut802.

As discussed above, by turning off a variable number of current paths and corresponding transistors, many different current values may be created. As shown in FIG. 6, for example, with only three illustrative path transistors (e.g., P601, P602, P603), the representative precision current source 600 may produce reference path to output path ratios of 1:2, 2:1 or 1:1 by selectively enabling the first, second and third switch sets corresponding to each current branch 610, 620 and 630. This selective control of current paths and output currents may also be accomplished using only enable transistors (e.g., enable transistors P604a, P604b, P605a, P605b, P606a, P606b) within each current branch, as discussed above. However, the selective control of current paths may further include the reference and output path cascode OpAmps 861, 862 and inverter control circuits 830, 840, as shown in FIG. 8.

Figure 9:
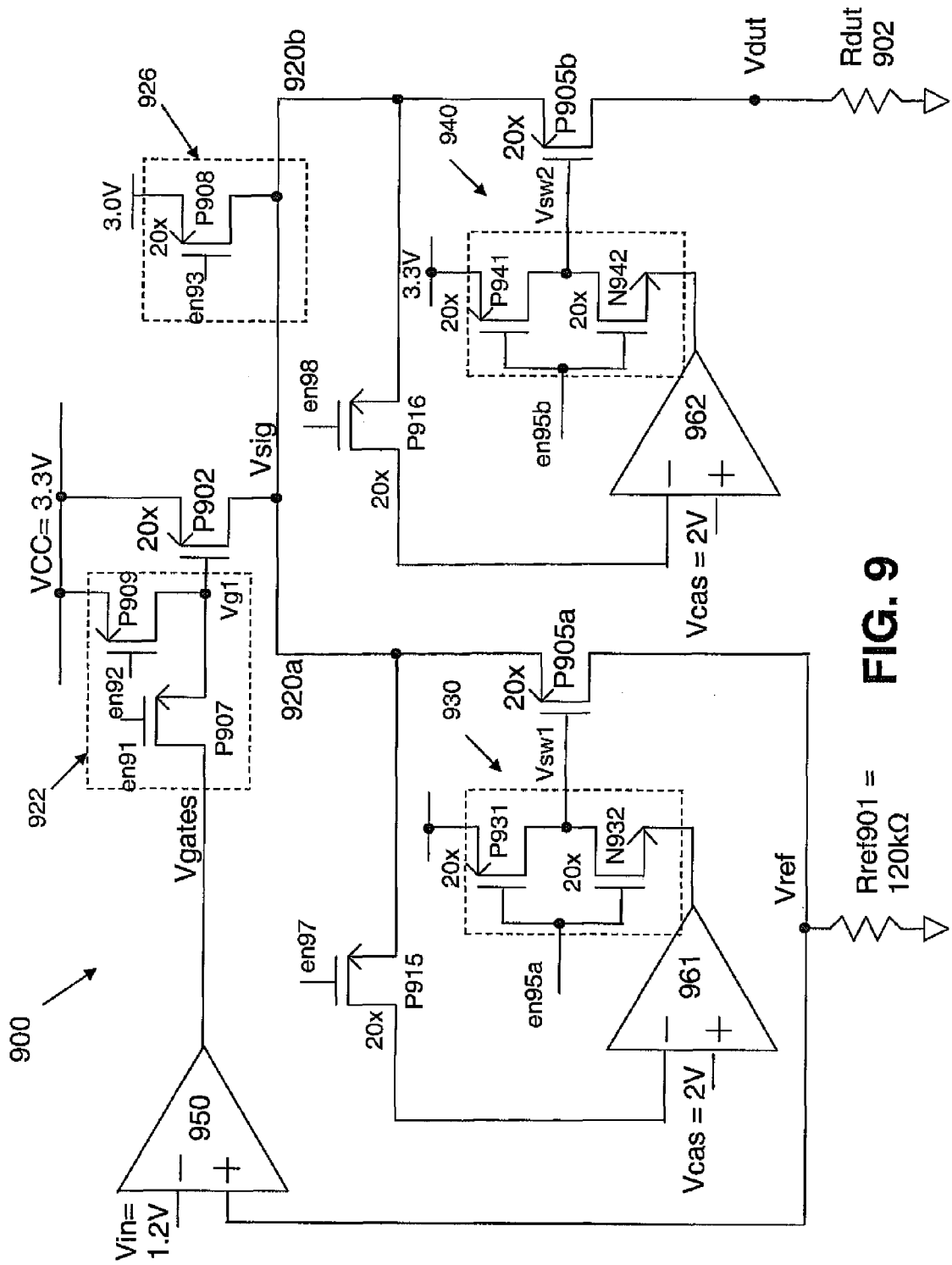
FIG. 9 is a circuit diagram illustrating a precision current source, according to a representative embodiment.

FIG. 9 is a circuit diagram illustrating a precision current source, according to a representative embodiment, which builds on the current sources shown in FIGS. 7-8. For purposes of simplifying explanation, FIG. 9 shows only a single path transistor P902 of current branch 920, which is connectable to each of the reference path and the output path through connecting branches 920a and 920b of switch sw920. It is understood that additional current branches and corresponding path transistors having the same basic configuration as shown in the example of FIG. 9 may be added to the precision current source 900 to further approximate an actual system.

Referring to FIG. 9, the representative precision current source 900 includes twenty path transistors P902 (indicated by 20x) and thus twenty corresponding current paths 920, all of which function in substantially the same manner. However, only one representative path transistor 920 will be discussed to simplify the explanation of precision current source 900.

In the depicted embodiment, the representative path transistor P902 may be connected to a leakage prevention circuit P922 for assuring shut-off, as discussed above with respect to leakage prevention circuit P522 of FIG. 5. The leakage prevention circuit P922 includes leakage prevention transistors P907 and P909, which are respectively controlled by enable signals en91 and en92. Transistor P907 is shut off to selectively disconnect path transistor P902 from Vgates output by OpAmp 950. At the same time, transistor P909 is turned on to force voltage node Vg1 to a high voltage (3.3V), which shuts off path transistor P902.

The representative path transistor P902 includes a source connected to high voltage source Vcc (e.g., 3.3V) and a drain connected to voltage node Vsig, which is selectively connectable to both the reference path, including connecting branch 920a and Rref901, and the output path, including connecting branch 920b and Rdut902. Selection of connecting branch 920a or 920b is implemented using enable transistor P905a or P905b and corresponding enable signals en95a or en95b, respectively. Enable transistors P915 and P916 selectively disconnect current branch 920 from the cascode OpAmps 961 and 962, respectively, in response to enable signals en97 and en98, when corresponding enable transistors 905a and 905b are off, as discussed above with respect to enable transistors P815 and P816 of FIG. 8.

Precision current source 900 also includes leak prevention circuit 925, which has leak prevention transistor P908 controlled by enable signal en93. Transistor P908 is turned on when enable transistors P905a and P905b are shut off, in order to force voltage node Vsig to a high voltage level (3.0V), so that enable transistors P905a and/or P905b have a 3.3V gate voltage and a 3.0V source voltage. The leak prevention circuit 925 functions in substantially the same manner as discussed above with respect to leak prevention circuit 525 of FIG. 5.

The reference path includes cascode OpAmp 961, which is connected to inverter control circuit 930 and enable transistor P905a. The input of cascode OpAmp 961 is connected to cascode voltage Vcas1 (e.g., 2.0V) and Vsig, and the output is connected to the inverter control circuit 930. The inverter control circuit 930 includes inverter transistors P931 and N932, which have opposite conductivity types, gated to enable signal en95a. The inverter transistor P931 includes a source connected to a high voltage source (e.g., 3.3V) and a drain connected to enable voltage node Ven1, and inverter transistor N932 includes a source connected to the output of cascode OpAmp 961 and a drain connected to the enable voltage node Ven1. The inverter control circuit 930 and enable transistor P903 thus operate in substantially the same manner as described above with respect to the inverter control circuit 830 and enable transistor P803 of FIG. 8.

The output path includes cascode OpAmp 962, which is connected to inverter control circuit 940 and enable transistor P905b. The input of cascode OpAmp 962 is connected to cascode voltage Vcas2 (e.g., 2.0V) and Vsig, and the output is connected to the inverter control circuit 940. The inverter control circuit 940 includes inverter transistors P941 and N942, which have opposite conductivity types, gated to enable signal en95b. The inverter transistor P941 includes a source connected to a high voltage source (e.g., 3.3V) and a drain connected to enable voltage Ven2, and inverter transistor N932 includes a source connected to the output of cascode OpAmp 962 and a drain connected to the enable voltage Ven2. The inverter control circuit 940 and enable transistor P904 thus operate in substantially the same manner as described above with respect to the inverter control circuit 840 and enable transistor P804 of FIG. 8. In the example shown in FIG. 9, the precision current source 900 uses only one of the main OpAmp 950 and two of the cascode OpAmps 961, 962.

Notably, any or all of the twenty path transistors 902 may be selectively included in the reference path (connected to Rref901 via connecting branch 920a) or in the output path (connected to Rdut902 via connecting branch 920b). Also, FIG. 9 indicates twenty path transistors 902, twenty enable transistors P905a, P905b, P915, P916, twenty inverter control circuits 930, 940 and twenty leak prevention circuits 925 (each indicated by 20x). However, it is understood that various embodiments may include other numbers and combinations of these components, without departing from the spirit and scope of the present teachings, to provide unique benefits for any particular situation or to meet application specific design requirements of various implementations, as would be apparent to one skilled in the art.

Figure 10:
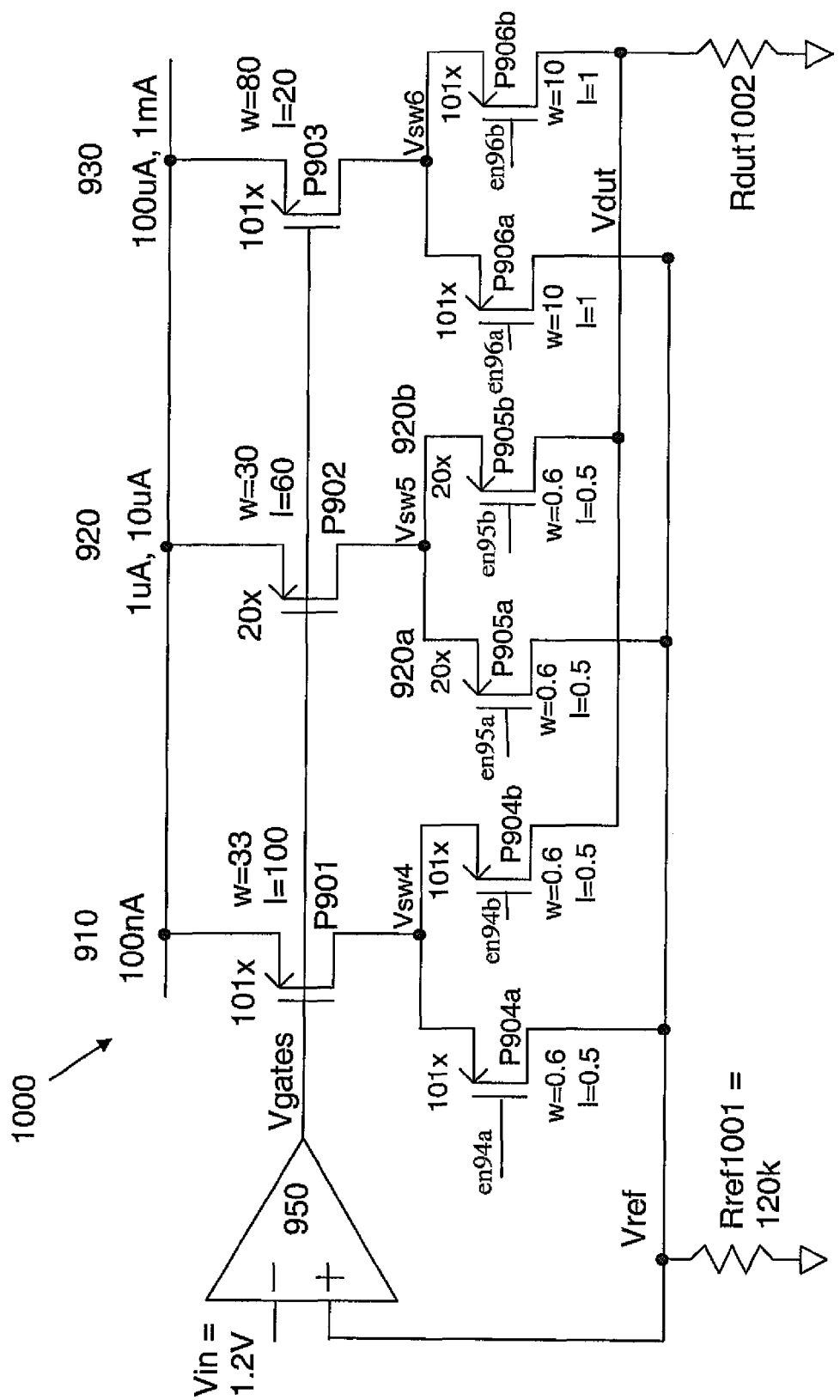
FIG. 10 is a circuit diagram illustrating a precision current source, according to a representative embodiment.

FIG. 10 is a circuit diagram illustrating a precision current source, according to a representative embodiment, which builds on the precision current sources shown in FIGS. 6 and 9. In particular, FIG. 10 shows an expanded precision current source 1000, which provides the option of five different currents over five decades (i.e., 100 nA, 1 μA, 10 μA, 100 μA, and 1 mA) using three groups 1010, 1020 and 1030 of representative current branches 910, 920 and 930, respectively.

Notably, the group 1020 is intended to include the twenty current branches 920 and twenty corresponding path transistors P902 (indicated by 20x), originally described with respect to FIG. 9, in order to illustrate how the single transistor representation may be included within a more comprehensive system. Further, although only eleven path transistors P902 are needed for generating the 1 μA and 10 μA currents indicated, the depicted embodiment includes twenty path transistors P902 in order to increase accuracy through averaging, for example. Likewise, the group 1010 is intended to include 101 current branches 910 and 101 corresponding path transistors P901 (indicated by 101x), and group 1030 is intended to include 101 current branches 930 and 101 corresponding path transistors P903 (indicated by 101x). However, in order to simplify the explanation, FIG. 10 is discussed referencing single representative current branches and path transistors.

As discussed above with respect to path transistors P601, P602 and P603 of FIG. 6, each of the representative path transistors P901, P902 and P903 in FIG. 10 may be selectively connected to one of the reference resistance Rref1001 or the DUT resistance Rdut1002. Each path transistor P901, P902 and P903 may be a PMOS transistor, for example, and has a source connected to a voltage source Vcc (e.g., 3.3V), a gate connected to the output voltage (Vgates) of OpAmp 950 and a drain connected to a corresponding enable node Vsw4, Vsw5 and Vsw6. Switch node Vsw4 is connected to a first switch sw910 including enable transistors P904a and P904b for selectively connecting path transistor P901 to the reference resistance Rref1001 or the DUT resistance Rdut1002, respectively. Likewise, enable node Vsw5 is connected to a second switch sw920 including enable transistors P905a and P905b for selectively connecting path transistor P902 to Rref1001 or Rdut1002, respectively, and enable node Vsw6 is connected to a third switch sw930 including enable transistors P906a and P906b for selectively connecting path transistor P903 to Rref1001 or Rdut1002, respectively. The enable transistors P904a, P904b, P905a, P905b, P906a and P906b are separately enabled by corresponding enable signals en94a, en94b, en95a, en95b, en96a and en96b.

In any of the first through third switches sw910-sw930, only one enable transistor P904a or P904b, P905a or P905b, and P906a or P906b may be on at a time, or both may be off. The corresponding current branches 910, 920 and 930 (e.g., including path transistors P901, P902 and P903) may therefore be selectively connected to only one of Rref1001 or Rdut1002 at a time, or disconnected from both Rref1001 and Rdut1002. This process enables selection and rotation of transistors among the reference path, the output path and no path, as discussed above.

Although not explicitly depicted in FIG. 10, it is understood that various embodiments may include features of FIGS. 5-9, as would be appreciated by one having ordinary skill in the art. For example, each of the path transistors P901, P902 and P903, as well as each of the enable transistors P904a, P904b, P905a, P905b, P906a and P906b, may be connected to a corresponding leakage prevention circuit, as shown in FIGS. 5 and 9, to assure shut off and/or to prevent current leakage when the transistors in an off state. Also, cascode OpAmps may be included in the reference path and the output path, as shown in FIGS. 7-9. Likewise, inverter control circuits may be connected between the cascode OpAmps and the enable transistors of each connecting branch (e.g., P904a, P904b, P905a, P905b, P906a and P906b) to provide enable signals, and additional enable transistors may by included to disconnect the connecting branches from the cascode OpAmps when the enable transistors of the corresponding connecting branches (e.g., P904a, P904b, P905a, P905b, P906a and P906b) are off, as shown in FIGS. 8-9.

FIG. 10 includes representative voltage values, resistance values and transistor sizes to provide an illustrative configuration for purposes of explanation. For example, Vin is 1.2V and Rref1001 is 120 kΩ. Path transistor P901 has a width of 33 μm and a length of 100 μm, path transistor P902 has a width of 30 μm and a length of 60 μm, and path transistor P903 has a width of 80 μm and a length of 20 μm. Each of the enable transistors P904a, P904b, P905a and 905b has a width of 0.6 μm and a length of 0.5 μm and each of the enable transistors P906a and P906b has a width of 10 μm and a length of 1.0 μm. Of course, the actual values and sizes may vary to provide unique benefits for any particular situation or to meet application specific design requirements of various implementations, as would be apparent to one skilled in the art.

The precision current source 1000 provides increased precision, reliability and flexibility. For example, by choosing combinations of path transistors P903 in current branch 930, the precision current source 1000 may output the 100 uA and 1 mA as shown, as well as many more currents. Also, in the current source 1000, one current branch may be used in the reference path and any number of the remaining current branches (even from different groups having different size transistors) may be used in the output path to provide a large variety of output currents, although the currents indicated over current branches 910, 920 and 930 in FIG. 10 indicate the current levels calibrated for best accuracy.

For example, for every additional current branch 930 of group 1030 added to the output path, the representative current source 1000 provides an addition 10 uA of output current. Also, when the number of current branches and corresponding path transistors selected for the reference path is smaller than the number of current branches and corresponding path transistors selected for the output path, the output current increases with respect to the reference current (i.e., multiplication). In contrast, when the number of current branches and corresponding path transistors selected for the reference path is larger than the number of current branches and corresponding path transistors selected for the output path, the output current decreases with respect to the reference current (i.e., division). However, it is understood that, in various embodiments, multiple branches may be included in the reference path, in which case further variations of output currents may be achieved.

Throughout the above description, it is understood that the transistors (e.g., including the path transistors, the enable transistors, inverter transistors, etc.) may be field-effect transistors (FETs), such as metal-oxide FETs (MOSFETs), for example. However, other types of FETs and/or other types of transistors within the purview of one of ordinary skill in the art may be incorporated into the precision current supplies, without departing from the spirit and scope of the present teachings. For example, the various transistors may include gallium arsenide FETs (GaAsFETs), silicon bipolar junction transistors (BJTs), high electron mobility transistors (HEMTs), pseudomorphic HEMTs, heterostructure FETs (HFETs), junction-gate FETs (JFETs), metal-semiconductor FETs (MESFETs), etc. Further, it is understood that the sources/drains of the various transistors may be reversed, without affecting the relevant functionality of the precision current source, depending on design factors of various embodiments.

The illustrative embodiments enable providing a variety of precision currents, and doing so without overusing transistors. Accordingly, the precision current source is more flexible, accurate, robust and reliable. Also, a precision current source with a single main OpAmp and switches for selectively connecting various current branches increases efficiency and reduces costs and overall circuit size.

In view of this disclosure it is noted that variant level shifters and the like can be implemented in keeping with the present teachings. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A device for providing a precision current, comprising:
  a first operational amplifier configured to output a gate voltage based on a reference voltage based on a reference current and an input voltage;
  a plurality of path transistors having a corresponding plurality of gates connected to the first operational amplifier to receive the gate voltage, each path transistor being connected to a first enable transistor configured to selectively connect the path transistor to a reference path and a second enable transistor configured to selectively connect the path transistor to an output path, the first and second enable transistors being separately enabled by first and second enable signals, respectively,
  wherein at least one path transistor of the plurality of path transistors is connected to the reference path through a corresponding first enable transistor to provide the reference current, and wherein at least one other path transistor of the plurality of path transistors is connected to the output path through a corresponding second enable transistor to provide the precision current based on the reference current.

2. The device of claim 1, wherein the at least one path transistor connected to the reference path and the at least one other path transistor connected to the output path comprise a current mirror.

3. The device of claim 2, wherein the first and second enable transistors connected to each path transistor of the plurality of path transistors are not enabled at the same time.

4. A device of for providing a precision current, comprising:
  a first operational amplifier configured to output a gate voltage based on a first reference voltage and an input voltage;
  a plurality of path transistors having a corresponding plurality of gates connected to the first operational amplifier to receive the gate voltage, each path transistor being connected to a first enable transistor configured to selectively connect the path transistor to a reference path and a second enable transistor configured to selectively connect the path transistor to an output path, the first and second enable transistors being separately enabled by first and second enable signals, respectively, wherein at least one path transistor of the plurality of path transistors is connected to the reference path through a corresponding first enable transistor to provide a reference current, and wherein at least one other path transistor of the plurality of path transistors is connected to the output path through a corresponding second enable transistor to provide the precision current based on the reference current;
  a second operational amplifier, located in the reference path and configured to provide a first enable voltage to the first enable transistor corresponding to the at least one path transistor connected to the reference path, the first enable voltage being based on a second reference voltage and a drain voltage of the at least one path transistor input to second operational amplifier; and a third operational amplifier, located in the output path and configured to provide a second enable voltage to the second enable transistor corresponding to the at least one other path transistor connected to the output path, the second enable voltage being based on a third reference voltage and a drain voltage of the at least one other path transistor input to third operational amplifier.

5. The device of claim 4, wherein the second and third operational amplifiers force drain voltages of the plurality of path transistors to be the same.

6. The device of claim 5, wherein the first reference voltage comprises a precise voltage and each of the second and third reference voltages comprises an imprecise voltage.

7. The device of claim 4, further comprising:
a third enable transistor configured to disconnect the at least one path transistor from the second operational amplifier when the first enable transistor corresponding to the at least one path transistor is not enabled; and
a fourth enable transistor configured to disconnect the at least one other path transistor from the third operational amplifier when the second enable transistor corresponding to the at least one other path transistor is not enabled.

8. The device of claim 4, further comprising:
a first inverter control circuit, connected to an output of the second operational amplifier and configured to provide the first enable voltage to the first enable transistor corresponding to the at least one path transistor connected to the reference path in response to the first enable signal; and
a second inverter control circuit, connected to an output of the third operational amplifier and configured to provide the second enable voltage to the second enable transistor corresponding to the at least one other path transistor connected to the output path in response to the second enable signal.

9. The device of claim 8, wherein the first inverter control circuit comprises a plurality of first inverter transistors having gates connected to the first enable signal and drains connected to the first enable voltage, a source of one first inverter transistor being connected to a high voltage and a source of another first inverter transistor being connected to the output of the second operational amplifier, and
wherein the second inverter control circuit comprises a plurality of second inverter transistors having gates connected to the second enable signal and drains connected to the second enable voltage, a source of one second inverter transistor being connected to the high voltage and a source of another second inverter transistor being connected to the output of the third operational amplifier.

10. The device of claim 1, further comprising:
a plurality of leakage prevention circuits corresponding to the plurality of path transistors, each leakage prevention circuit being configured to selectively disconnect the gate of the corresponding path transistor from the first operational amplifier when the corresponding path transistor is not connected to either the reference path or the output path.

11. The device of claim 10, wherein each leakage prevention circuit of the plurality of leakage prevention circuits comprises a first leakage prevention transistor connected between the first operational amplifier and the gate of the corresponding path transistor, and a second leakage prevention transistor connected between the gate of the corresponding path transistor and a high voltage source.

12. The device of claim 1, further comprising:
a plurality of leakage prevention circuits respectively connected to the first and second enable transistors corresponding to each of the plurality of path transistors, the leakage prevention circuits being configured to force leak prevention voltages on sources of the first and second enable transistors,
wherein the leak prevention voltages are substantially the same as gate voltages on gates of the first and second enable transistors when the first and second enable transistors are off.

13. The device of claim 1, wherein the at least one path transistor of the plurality of path transistors is selected to be connected to the reference path through the corresponding first enable transistor based on at least one property of the at least one path transistor.

14. The device of claim 1, wherein the precision current is output to a device under test.

15. A device for providing a precision current, comprising:
a main operational amplifier configured to output a gate voltage based on a main reference voltage and an input voltage;
a plurality of current branches, each current branch comprising a path transistor gated to the operational amplifier and a switch for selectively connecting the path transistor to one of a reference path and an output path,
wherein at least a first current branch of the plurality of current branches is initially connected to the reference path through a corresponding first switch to provide a reference current, and at the same time at least a second current branch of the plurality of current branches is initially connected to the output path through a corresponding second switch to provide the precision current based on the reference current, and
wherein the second current branch is subsequently rotated to be connected to the reference path through the corresponding second switch to provide the reference current.

16. The device of claim 15, wherein the first current branch is subsequently rotated to be connected to the output path through the corresponding first switch to provide the precision current, while the second current branch is connected to the reference path.

17. The device of claim 15, wherein the switch of each current branch comprises a first enable transistor for selectively connecting the current branch to the reference path and second enable transistor for selectively connecting the current branch to the output path, the first and second enable transistors being gated to first and second enable signals, respectively.

18. The device of claim 17, further comprising:
a first operational transconductance amplifier (OTA) configured to provide a first enable voltage to the first enable transistor of each current branch connected to the reference path based on a first OTA reference voltage and a drain voltage of each path transistor of the current branch connected to the reference path; and
a second OTA configured to provide a second enable voltage to the second enable transistor of each current branch connected to the output path based on a second OTA reference voltage and a drain voltage of each path transistor of each current branch connected to the output path.

19. The device of claim 17, wherein the first enable voltage is provided to the first enable transistor of each current branch connected to the reference path in response to the corresponding first enable signal; and wherein the second enable voltage is provided to the second enable transistor of each current branch connected to the output path in response to the corresponding second enable signal.

20. The device of claim 15, wherein at least a third current branch of the plurality of current branches is initially connected to neither the reference path nor the output path through a corresponding third switch at the same time the first current branch is initially connected to the reference path through the corresponding first switch and the second current branch is initially connected to the output path through the corresponding second switch.

* * * * *

UNITED STATES PATENT AND TRADEMARK OFFICE
CERTIFICATE OF CORRECTION

| | | |
|---|---|---|
| PATENT NO. | : 7,893,756 B2 | |
| APPLICATION NO. | : 12/271028 | |
| DATED | : February 22, 2011 | |
| INVENTOR(S) | : Jill Marie Pamperin et al. | |

It is certified that error appears in the above-identified patent and that said Letters Patent is hereby corrected as shown below:

In column 14, line 44, in Claim 4, after "device" delete "of".

Signed and Sealed this
Nineteenth Day of April, 2011

David J. Kappos
*Director of the United States Patent and Trademark Office*